LOW TEMPERATURE SILICON ETCH

Filed Nov. 20, 1969

2 Sheets-Sheet 1

SCHEMATIC DIAGRAM OF LOW-TEMPERATURE GASEOUS ETCHING APPARATUS.

INVENTOR.
JOHN P. DISMUKES
BY
[signature]
Attorney

LOW TEMPERATURE SILICON ETCH

Filed Nov. 20, 1969 2 Sheets-Sheet 2

INVENTOR.
JOHN P. DISMUKES
BY
Attorney

United States Patent Office 3,669,774

Patented June 13, 1972

3,669,774

LOW TEMPERATURE SILICON ETCH

John Pickett Dismukes, Princeton, N.J., assignor to RCA Corporation

Filed Nov. 20, 1969, Ser. No. 878,320

Int. Cl. H01l 7/50, 7/54

U.S. Cl. 156—17 3 Claims

ABSTRACT OF THE DISCLOSURE

A mechanically polished silicon wafer is etched to remove surface damaged material and give a smooth surface by etching at a temperature of from about 800 to 1050° C. in a gas mixture consisting of a carrier gas of $H_2$, He or a mixture thereof, a small concentration of a gas reactive with $SiO_2$ such as HF, $ClF_3$ or $BrF_5$ and a small concentration of a gas reactive silicon such as HBr, HI, HCl, $Cl_2$, $Br_2$, or $I_2$.

BACKGROUND OF THE INVENTION

The invention herein described was made in the course of or under a contract with the Department of the Air Force.

This invention relates to a method for etching silicon.

In order to deposit epitaxial layers of silicon on a silicon substrate for the production of semiconductor devices the substrate surface must first be smooth, flat and clean. Substrate surfaces are generally prepared by a combination of mechanical and chemical polishing procedures. Mechanical polishing of a silicon surface leaves a mechanically damaged layer on the surface of the polished substrate which is then removed by a chemical etching procedure.

It is preferred to etch the silicon body at approximately the same or at a lower temperature range than that used for the epitaxial deposition of silicon on the etched surface.

Present manufacturing technology utilizes hydrogen reduction of silicon tetrachloride or trichlorosilane in the temperature range of from about 1200 to 1300° C. for epitaxial deposition of silicon on a silicon substrate. Such substrates are generally etched by mixtures of hydrogen with either hydrogen bromide or hydrogen chloride gases in the same temperature range. Within this temperature range silicon dioxide layers that tend to form on the silicon substrate at lower temperature react with the silicon of the substrate to produce gaseous silicon monoxide thereby providing an oxide-free surface for reaction with the etching gases.

Lower temperature reactions have been sought for both the epitaxial growth of silicon on silicon and for the vapor-phase etching of the silicon substrate. The use of such lower temperatures generally provides greater control over impurity doping and reduces the amount of undesirable impurities which enter the silicon during processing. Recently D. Richmand and R. H. Arlett have reported, at page 200 in "Semiconductor Silicon" edited by R. R. Haberacht and E. L. Kern and published by the Electrochemical Society, Inc., N.Y., a method for the preparation of epitaxially grown silicon layers at temperatures as low as 800–900° C. However, a suitable etching process for the preparation of smooth, flat and clean substrate surfaces was not available to prepare the substrate surface for epitaxial growth of silicon at these low temperatures.

I have now found a method for etching silicon at temperatures less than 1050° C. which produces an extremely smooth silicon surface.

SUMMARY OF THE INVENTION

A method of forming a smooth etched surface on silicon comprising the step of etching said surface at a temperature of less than 1050° C. in a gas mixture comprising: a gas which reacts with silicon dioxide at the etching temperature to form gaseous products; another gas which reacts with silicon at the etching temperature to form a gaseous product; and a diluting or carrier gas which comprises a substantial proportion of the gas mixture. The diluting gas is selected from the group consisting of a reducing gas, an inert gas, and a mixture of reducing gas and inert gas.

DESCRIPTION OF THE PREFERRED EMBODIMENTS

Figure 1:
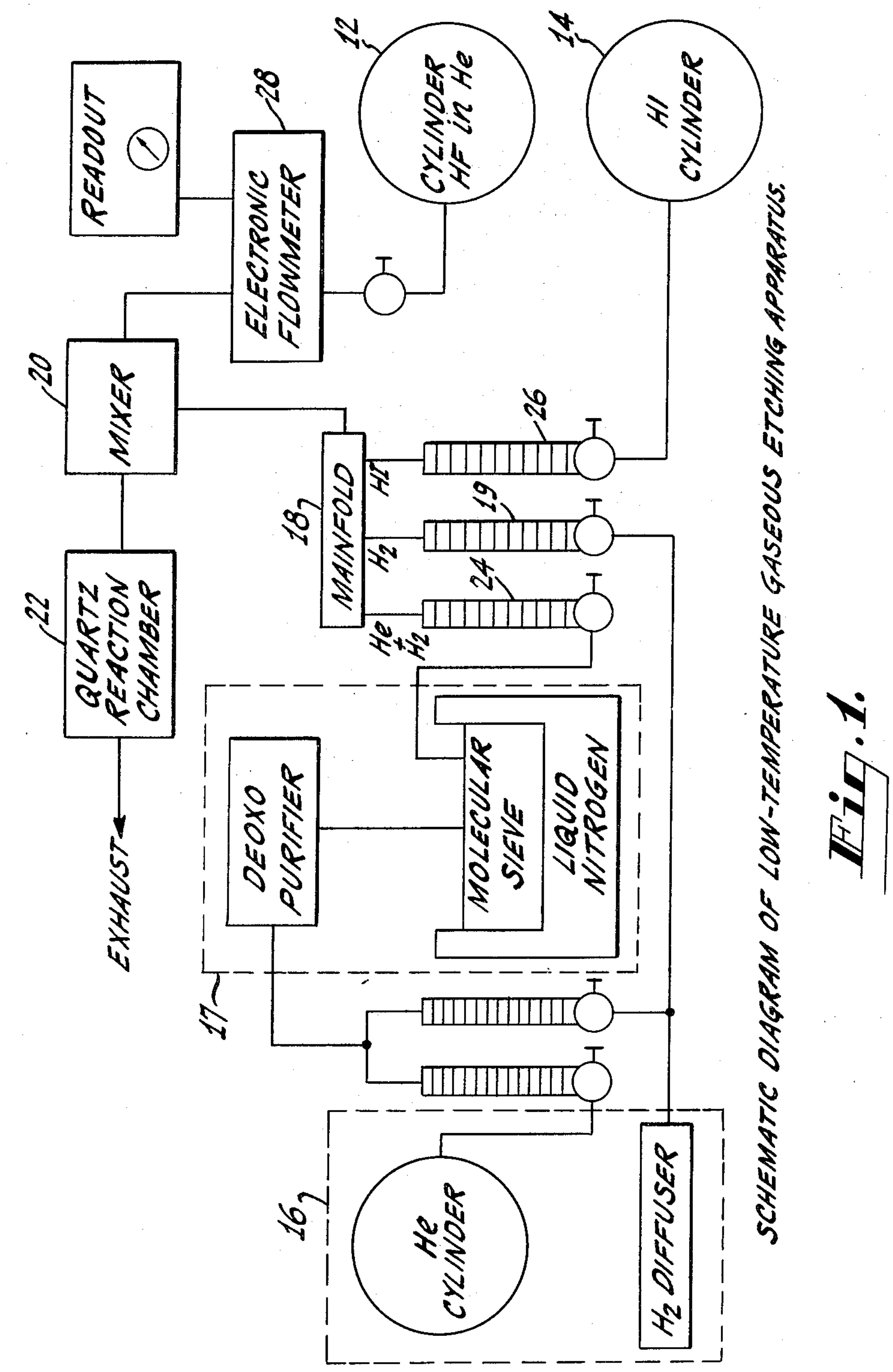
FIG. 1 is a flow chart indicating the step and apparatus used in practicing the novel silicon low temperature etch technique.

Referring to FIG. 1, there is shown three gas sources, a source of gas 12 which is reactive with $SiO_2$, a source of gas 14 which is reactive with Si and a carrier gas source 16 which comprises a reducing gas and/or an inert gas, each separately controllable. The reducing and/or inert gases 16 pass through a purifying unit 17 for removing essentially all traces of oxygen and water vapor from these gases The carrier gases 16 are shown to come together with the silicon reactive gas 14 in a manifold 18. The reducing gas may bypass the purifying unit 17 and be admitted to the manifold 18 through a flow meter 19. From the manifold, the gases 14 and 16 enter a mixer 20 where they are mixed with the $SiO_2$ reactive gas 12. The mixed gases 12, 14 and 16 finally pass through a heated reaction chamber 22 containing the silicon to be etched. The unreacted gases and the gaseous reaction products are exhausted from the reaction chamber 22.

The apparatus also includes flow meters 24, 26 and 28 in the gas lines as shown so as to monitor the flow of each of the gases introduced into the reaction chamber.

The preferred $SiO_2$ reactive gas is HF. The products of the reaction between HF and $SiO_2$ are all gaseous at the reaction temperatures. Other gases which may be used with or in place of HF and also result in gaseous products includes the inter-halogen gases such as $ClF_3$ and $BrF_5$. It is preferred that the HF or other gas used in its place be in the form of a gas mixture with ultra-pure reducing gas and/or inert gas containing from about .1–3 volume percent and HF or like gas. It is also preferred that the HF be introduced through stainless steel tubing.

The preferred gas which is reactive with Si and results in gaseous products at the reaction temperature is HI. Other gases reactive with Si which may be used with or in place of HI include HCl, HBr, $Cl_2$, $I_2$ and $Br_2$.

The preferred reducing gas and inert gas is a mixture of hydrogen and ultra pure helium respectively. Although a mixture of these gases is generally preferred, one may use pure $H_2$ or pure He depending upon the particular temperature and reactive gases employed in the process.

The wall of the reaction chamber is preferably cooled such as by means of a water jacket. The silicon wafer to be etched in the reaction chamber is heated by RF heating preferably using a silicon carbide coated graphite susceptor. There may also be a silicon coating over the silicon carbide coating of the susceptor.

Typical total gas flows of the final gas mixture are in the order of 10 liters per minute with an average linear flow velocity in the order of 50 cm./sec.

Typically the concentration of HF in the final gas mixture is from about 0.0005–0.1 volume percent and preferably from about 0.0005–0.01 volume percent.

The typical concentration of HI in the final gas mixture is from about 0.2 to 2 volume percent preferably from 0.5 to 1 volume percent.

While the preferred reaction temperature of the silicon is from about 900–1000° C., smooth etched surfaces can be achieved at temperatures up to about 1050° C. and at temperatures below 900° C. However, at temperatures much below 800° C. the reaction rate is generally impractically slow.

The specific operating parameters for optimum etching of silicon to produce a smooth surface depends upon and varies with the desired etch rate. For example, the etch rate for a given gas mixture increases with temperature while the etch rate at a given temperature increases with increasing HF and/or HI concentration.

The novel method of etching silicon is not limited to silicon bodies having any specific crystal orientation. In addition the silicon to be etched may be either N type, P type, or intrinsic and may be of either high or low resistivity.

Example I

A 1 inch diameter, 8 mil thick, mechanically polished, P type, 0.01 ohm-cm., silicon wafer cut along a (111) crystallographic plane is placed on a silicon carbide coated graphite susceptor in a water cooled quartz reaction chamber. The wafer is heated by RF induction heating to a temperature of 900° C. under a flow of 10 liters/min. of an 80 volume percent He–20 volume percent $H_2$ carrier gas mixture. The $H_2$ of the carrier gas is palladium diffused and the helium is purified by passing it together with about 0.1 volume percent $H_2$ through a platinum catalyst and Linde 5A and Linde 13X molecular sieves which are cooled to liquid nitrogen temperature. When the temperature of the wafer stabilizes at 900° C. 1 vol. percent HI and $10^{-3}$ vol. percent HF are introduced into and mixed with the carrier gas stream. This mixture of carrier gas and reactive etch gases are allowed to flow for about 30 minutes. The reactive etch gases are then removed and the apparatus is flushed for 5 minutes with carrier gas after which the wafer is allowed to cool to room temperature.

The etch rate under the above conditions as measured by weight loss of the silicon wafer is about 0.13$\mu$/min. The surface of the etched wafer is examined optically at 500$\times$ and by scanning electron microscopy at 10,000$\times$. Wafers prepared as described above are smooth and featureless except for a fine array of steps of about 500 A. in height and width.

EXAMPLE II

A 1 inch diameter, 8 mil thick mechanically polished, N type, 0.0005 ohm-cm., (111) silicon wafer was etched in the same manner as described in Example I. The surface of the etched wafer was smooth to the limit of resolution of the electron microscope, about 100 A. The etch rate was 0.12$\mu$/min.

Example III

An N type wafer as described in Example II but cut along the (100) plane etched at a rate of 0.14$\mu$/min. under the same conditions and also resulted in a surface smoothness of at least about 100 A.

Example IV

A silicon wafer as described in Example I was etched in the same manner as set forth in that example except that the etch temperature was increased in 1000° C. At this temperature the etch rate increases to 0.30$\mu$/min. The etched surface remains smooth.

Example V

A silicon wafer as described in Example I was etched in the same manner as set forth in that example except that the concentration of HI was reduced to 0.5 vol. percent. This resulted in a decrease in the etch rate to 0.04$\mu$/min. The etched surface was smooth.

Example VI

A silicon wafer of the type described in Example II was etched as described in Example I except that the silicon carbide coated graphite susceptor had an overcoating of silicon and the concentration of HF was increased to $2\times10^{-3}$ vol. percent. The etch rate was only slightly reduced to 0.11$\mu$/min.

Example VII

A silicon wafer of the type described in Example II was etched at 900° C. by the same general procedures as set forth in Example I. In this case, however, the susceptor had an overcoating of silicon, the carrier gas consisted of 99.9 vol. percent He-0.1 vol. percent $H_2$ and the reactive etch gases were present in concentrations of $2\times10^{-3}$ vol. percent HF and 0.5 vol. percent HI. The etch gases were allowed to flow for only 15 minutes. The etch rate under these conditions was 0.13$\mu$/min. The resulting etched surface was smooth and featureless.

Example VIII

The procedure and conditions described in Example VII were followed except that the HI was replaced by 0.5 vol. percent HBr and the surface was etched for only 5 minutes. The etch rate here was 0.19$\mu$/min.

Example IX

The procedure and conditions described in Example VII were followed except that the HI was replaced by 0.5 vol. percent $Cl_2$ and the concentration of HI was $1\times10^{-3}$ vol. percent. The etch here was 0.53$\mu$/min.

Figure 2:
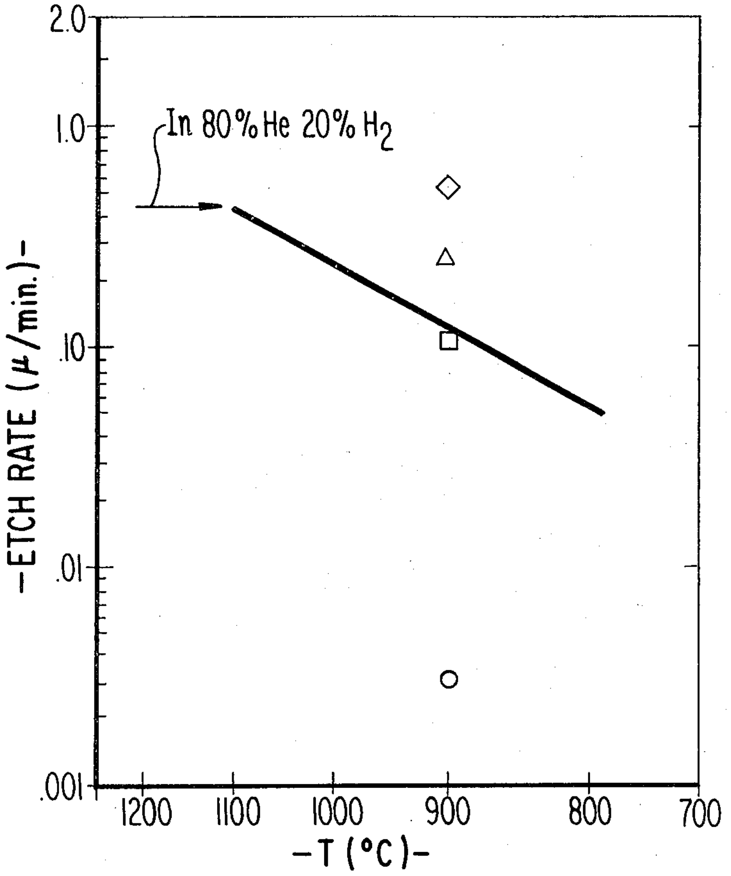
FIG. 2 is a plot of the etch rate of silicon as a function of temperature for an etching mixture consisting of 1 volume percent HI and $10^{-3}$ volume percent HF in an 80 volume percent HE-20 volume percent $H_2$ gas mixture.

Referring now to FIG. 2, there is shown a curve of etch rate in microns per minute as a function of the reaction temperature, in degrees centigrade, of the silicon body to be etched. The final gaseous mixture of the experiments represented by this curve consisted of 1% HI and $10^{-3}$ percent HF in an 80% He-20% $H_2$ mixture. The percentages given are all on a volume percent basis. The etched silicon produced under these etching conditions exhibited a smooth etched surface.

Also shown on the figure are four points representing etching at 900° C. under different conditions than those represented by the curve. The lower most point, shown by a circle, represents etching in a gas mixture consisting of 1 vol. percent HI in 100 vol. percent $H_2$. Although a smooth etched surface resulted under these conditions, the etch rate is too low for practical purposes. The second from lowest point, appearing just below the curve and shown as a square, represents etching in a gas mixture which is the same as that represented by the curve except without HF. Although the etch rate under these conditions is good, the resulting etched surface was rough. The next highest point, shown as a triangle, represents etching in a gas mixture similar to that represented by the curve except that the HF concentration was $10^{-1}$ vol. percent. Here, a somewhat rough surface also resulted at 900° C. indicating the preferred concentration of HF is below $10^{-1}$ vol. percent under the conditions of the experiment. The final point, shown as a diamond, represents etching of 1 vol. percent HI in pure He. A rough surface also results under these conditions.

A general observation that can be made from these points is that as the concentration of hydrogen in the gas mixture decreases the etch rate increases. Also as the concentration of HF increases the etch rate increases.

Figure 3:
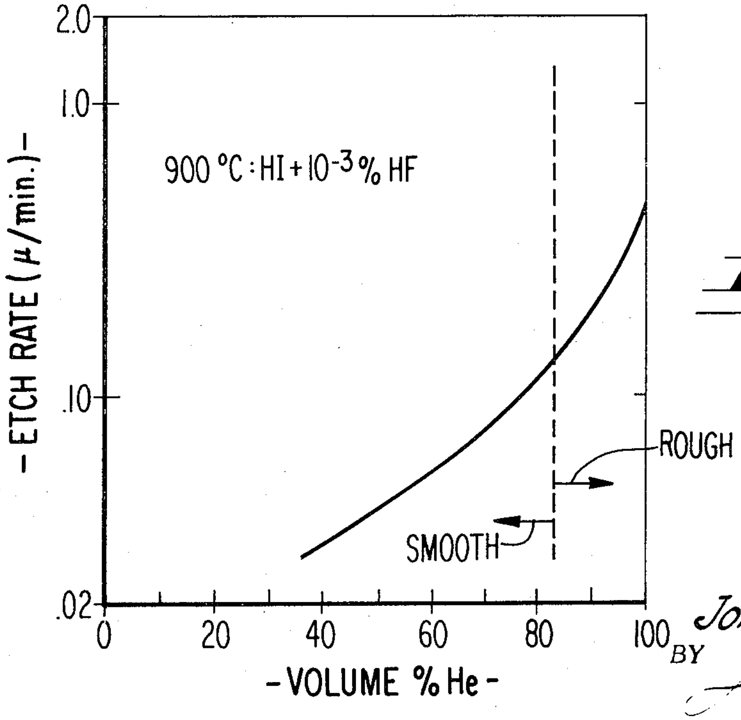
FIG. 3 is a plot of the etch rate of silicon as a function of the carrier gas composition.

The curve shown in FIG. 3 indicates the effect of the $H_2$/He ratio upon the etch rate for etching at 900° C. with 1 vol. percent HI and $10^{-3}$ vol. percent HF in varying volume percents of $H_2$ and He. It can be seen that the etch rate increases significantly as the volume percent of $H_2$ decreases. At 900° C., and 1 vol. percent HI and $10^{-3}$ vol. percent HF, the etched surface starts to become rough as the volume percent He goes above about 82%. However, reasonably smooth surfaces are attainable with a gas mixture consisting of ½ vol. percent HBr and $10^{-3}$ vol. percent HF in pure He. The etch rate of this mixture at 900° C. is about 12μ/hour.

The typical gas mixture of the novel method consists of from about 98–99.5 vol. percent carrier gas.

Although the examples indicate etching of silicon wafers, the novel etching technique can also be employed to etch epitaxially grown silicon surfaces.

I claim:

1. A method of etching a silicon body comprising the step of:

heating the silicon body to be etched to a temperature of from 800–1050° C. in a gas mixture comprising (i) a first gas which reacts with silicon dioxide at the etching temperature to form gaseous reaction products, said first gas comprising, (ii) a second gas which reacts with silicon at the etching temperature to form gaseous reaction products, said second gas selected from the group consisting of HI, HCl, HBr, $Cl_2$, $I_2$ and $Br_2$, and (iii) a carrier gas selected from the group consisting of pure helium, and a mixture of hydrogen and helium, said carrier gas comprising about 98 vol. percent of said gas mixture, said first gas being present in a concentration of from 0.0005 to 0.001 vol. percent, and said second gas being present in a concentration of from 0.5 to 2 vol. percent.

2. The method recited in claim 1, wherein said first gas is HF, said HF being present in a concentration of less than $10^{-3}$ volume percent in the gas mixture and wherein said second gas is HBr in a concentration of ½ volume percent in said gas mixture and wherein said carrier gas is pure helium.

3. The method recited in claim 1, wherein said HF is present in a concentration of less than $10^{-3}$ volume percent in the gas mixture, wherein said second gas is HBr in a concentration of ½ volume percent in said gas mixture, and wherein said carrier gas is pure helium.

References Cited

UNITED STATES PATENTS 3,511,727 5/1970 Hays ............... 156—17

OTHER REFERENCES

Etching and Polishing Behaviour of Ge and Si With HI, J. of Electrochemical Soc., pp. 812–16, Reisman et al., IBM Watson Res. Senter Reprint, vol. 112, No. 8, August 1965.

JACOB H. STEINBERG, Primary Examiner

U.S. Cl. X.R.

156—345

UNITED STATES PATENT OFFICE

CERTIFICATE OF CORRECTION

Patent No. 3,669,774 Dated June 19, 1972

Inventor(s) John P. Dismukes

It is certified that error appears in the above-identified patent and that said Letters Patent are hereby corrected as shown below:

Column 5, line 25 — after "comprising", insert --HF--

Column 6, line 6 through line 11, — cancel "first gas is HF, said HF being present in a concentration of less than $10^{-3}$ volume percent in the gas mixture and wherein said second gas is HBr in said gas mixture and wherein said carrier gas is pure helium" and insert therefor --mixture of helium and hydrogen consists of from 40 to 82 volume percent helium--

Signed and sealed this 26th day of September 1972.

(SEAL)
Attest:

EDWARD M.FLETCHER,JR.
Attesting Officer

ROBERT GOTTSCHALK
Commissioner of Patents